(12) United States Patent
Korber

(10) Patent No.: US 7,727,840 B2
(45) Date of Patent: Jun. 1, 2010

(54) FORMING INTEGRATED CIRCUIT DEVICES

(75) Inventor: Mark S. Korber, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 228 days.

(21) Appl. No.: 11/827,857

(22) Filed: Jul. 13, 2007

(65) Prior Publication Data

US 2007/0259529 A1  Nov. 8, 2007

Related U.S. Application Data

(62) Division of application No. 11/043,741, filed on Jan. 26, 2005, now Pat. No. 7,259,064.

(51) Int. Cl.
*H01L 21/8247* (2006.01)
(52) U.S. Cl. .............................. 438/258; 257/E21.179
(58) Field of Classification Search ......... 438/257–267; 257/E21.179
See application file for complete search history.

(56) References Cited

U.S. PATENT DOCUMENTS

| 5,175,120 | A | 12/1992 | Lee |
| 6,103,020 | A | 8/2000 | Roberts et al. |
| 2002/0132458 | A1 | 9/2002 | Chien et al. |
| 2005/0098821 | A1 | 5/2005 | Chao et al. |

*Primary Examiner*—Richard A. Booth
(74) *Attorney, Agent, or Firm*—Leffert Jay & Polglaze, P.A.

(57) ABSTRACT

Methods of forming integrated circuit devices are provided. A first mask layer is formed overlying a first portion of a semiconductor substrate. The first mask layer further overlies a second mask layer overlying a second portion of the semiconductor substrate. The first mask layer overlying the first portion of the semiconductor substrate is patterned to define areas for removal of one or more layers of material interposed between the semiconductor substrate and the first mask layer. Portions of the one or more layers of material exposed by the patterned first mask layer are removed to define elements of the integrated circuit device overlying the first portion of the semiconductor substrate.

29 Claims, 5 Drawing Sheets

FORMING INTEGRATED CIRCUIT DEVICES

RELATED APPLICATION

This application is a divisional of U.S. application Ser. No. 11/043,741, titled "FORMING INTEGRATED CIRCUIT DEVICES," filed Jan. 26, 2005 now U.S. Pat. No. 7,259,064, which application is assigned to the assignee of the present invention and the entire contents of which are incorporated herein by reference.

TECHNICAL FIELD OF THE INVENTION

The present invention relates generally to integrated circuit devices and in particular the present invention relates to forming integrated circuit devices.

BACKGROUND OF THE INVENTION

Memory devices are typically provided as internal storage areas in computers. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed on an individual basis by charging the floating gate. The charge can be removed from the floating gate by a block erase operation. The data in a cell is determined by the presence or absence of the charge on the floating gate.

Memory devices are typically formed as semiconductor devices on semiconductor substrates using semiconductor fabrication methods and may include a memory array portion that includes the array of memory cells disposed on the substrate and a periphery that may include logic devices disposed on the substrate, e.g., of row access circuitry and column access circuitry of the memory device.

For some applications, the layers for forming the memory devices in the memory array portion are formed overlying the substrate. The memory array portion is then patterned to form the individual memory cells. Then, the array junctions are implanted in the array portion. The layers for forming the logic devices on the periphery are formed overlying the substrate and are patterned for forming the logic devices of the periphery. However, this often requires forming a relatively thick mask layer, e.g., greater than about 5000 angstroms, overlying the array portion and the periphery to protect the array portion as the logic devices are defined in the periphery. One problem with using such thick mask layers is that it is hard to maintain critical dimensions of the pattern. Another problem with using such thick mask layers is that the resist tends to topple or fall over due to stresses that form during the formation of the logic devices on the periphery.

For the reasons stated above, and for other reasons stated below which will become apparent to those skilled in the art upon reading and understanding the present specification, there is a need in the art for alternatives for forming peripheries of semiconductor devices.

DETAILED DESCRIPTION

Figure 1:
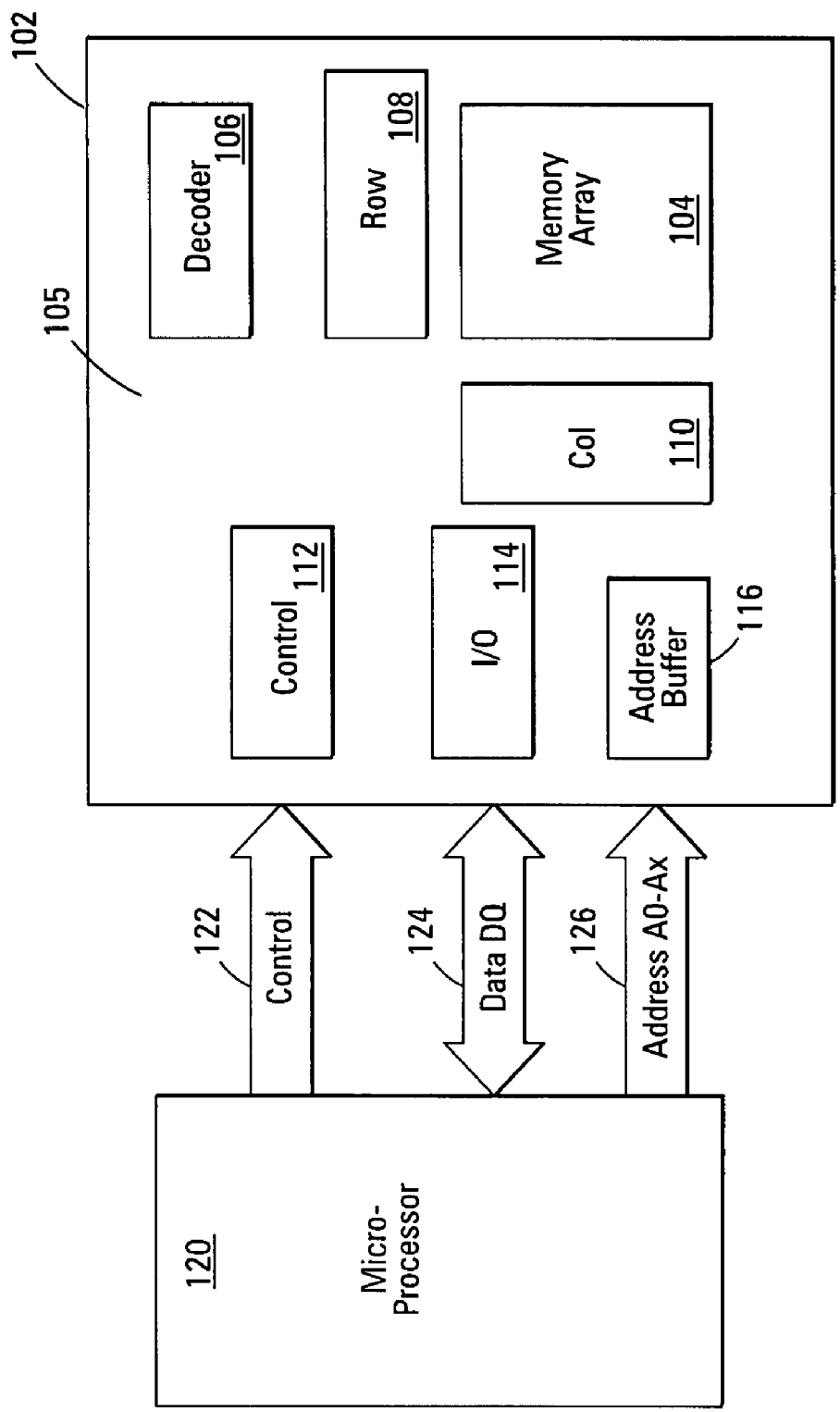
FIG. 1 is a block diagram illustration of an integrated circuit device, according to an embodiment of the invention.

In the following detailed description of the invention, reference is made to the accompanying drawings that form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The term wafer or substrate used in the following description includes any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

FIG. 1 is a block diagram illustration of an integrated circuit device, such as a processor, a memory device 102, etc., according to an embodiment of the invention. The memory device 102 may be fabricated as semiconductor device on a semiconductor substrate. Examples of memory devices include NAND or NOR flash memory devices, dynamic random access memory devices (DRAMs), static random access memory devices (SRAMs), or the like. For various embodiments, the device of FIG. 1 is formed using the methods of the present invention.

For one embodiment, memory device 102 includes an array of flash memory cells 104 and a region 105 peripheral to memory array 104 that includes an address decoder 106, row access circuitry 108, column access circuitry 110, control circuitry 112, Input/Output (I/O) circuitry 114, and an address buffer 116. The row access circuitry 108 and column access circuitry 110 may include high-voltage circuitry, such as high-voltage pumps. Memory device 100 may be coupled an external microprocessor 120, or memory controller, for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention.

The memory array 104 includes memory cells arranged in row and column fashion. For one embodiment, each of the memory cells includes a floating-gate field-effect transistor capable of holding a charge. The cells may be grouped into blocks. Each of the cells within a block can be electrically programmed on an individual basis by charging the floating gate. The charge can be removed from the floating gate by a block erase operation.

For one embodiment, memory array 104 is a NOR flash memory array. A control gate of each memory cell of a row of the array is connected to a word line, and a drain region of each memory cell of a column of the array is connected to a bit line. The memory array for NOR flash memory devices is accessed by row access circuitry, such as the row access circuitry 108 of memory device 102, activating a row of floating-gate memory cells by selecting the word line connected to their control gates. The row of selected memory cells then place their data values on the column bit lines by flowing a differing current, depending upon their programmed states, from a connected source line to the connected column bit lines.

For another embodiment, memory array 104 is a NAND flash memory array also arranged such that the control gate of each memory cell of a row of the array is connected to a word line. However, each memory cell is not directly connected to a column bit line by its drain region. Instead, the memory cells of the array are arranged together in strings (often termed NAND strings), e.g., of 32 each, with the memory cells connected together in series, source to drain, between a source line and a column bit line. The memory array for NAND flash memory devices is then accessed by row access circuitry, such as the row access circuitry 108 of memory device 102, activating a row of memory cells by selecting the word line connected to a control gate of a memory cell. In addition, the word lines connected to the control gates of unselected memory cells of each string are driven to operate the unselected memory cells of each string as pass transistors, so that they pass current in a manner that is unrestricted by their stored data values. Current then flows from the source line to the column bit line through each series connected string, restricted only by the selected memory cells of each string. This places the current-encoded data values of the row of selected memory cells on the column bit lines.

Figure 2A:
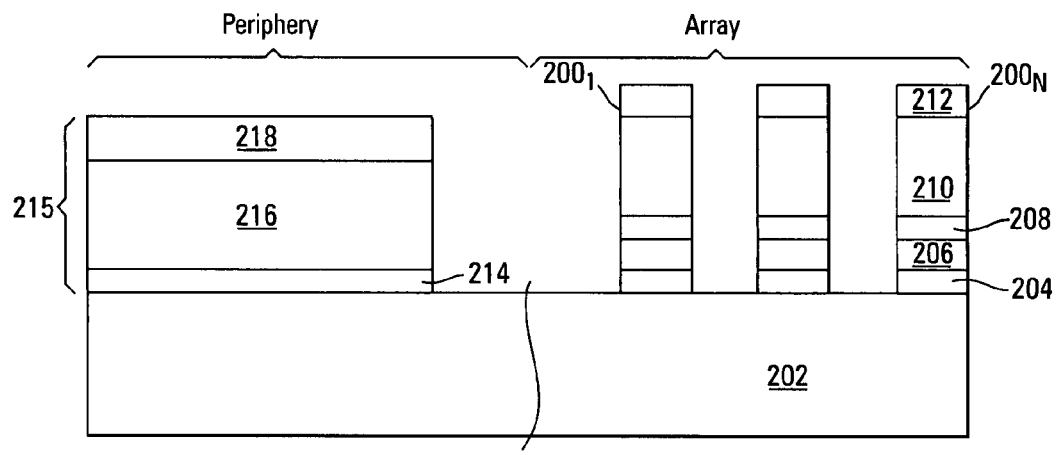
FIGS. 2A-2G are cross-sectional views of a portion of an integrated circuit device at various stages of fabrication in accordance with one embodiment of the invention.

FIGS. 2A-2G generally depict a method of forming a portion of an integrated device, such as memory device 102 of FIG. 1, in accordance with one embodiment of the invention. FIG. 2A depicts a portion of the memory device after several processing steps have occurred. The structure of FIG. 2A includes an array portion where an array of memory cells 200, such as of memory array 104 of memory device 102, have been formed. For one embodiment, each of the memory cells 200 is a floating-gate memory cell, such as a floating-gate transistor. The structure of FIG. 2A further includes a periphery, such as the region 105 of memory device 102, where logic devices, e.g., of row access circuitry 108 and column access circuitry 110 of memory 102 of FIG. 1, will be formed. For one embodiment, the logic devices include field-effect transistors.

Formation of the type of structure depicted in FIG. 2A is well known and will not be detailed herein. In general, the array and the periphery are formed separately on a silicon-containing substrate 202. The memory cells 200 each include a first (or tunnel) dielectric layer 204 formed on substrate 202, a first conductive (or floating gate layer) 206 formed on the tunnel dielectric layer 204, a second (or intergate) dielectric layer 208 formed on the floating gate layer 206, a second conductive layer (or control gate or word line) 210 formed on the intergate dielectric layer 208. For some embodiments, an optional protective cap layer 212 is formed on the word line 210. Note that FIG. 2A has been simplified to help focus on the invention and that it will be appreciated by those skilled in the art that the memory array portion also includes source/drain regions (not shown), word line connections (not shown), and bit line connections (not shown). The periphery includes a gate stack 215 formed on the substrate 202. Gate stack 215 includes a gate dielectric layer 214 formed on the substrate 202 and a control gate layer 216 formed on the gate dielectric layer 214. For some embodiments, an optional protective cap layer 218 is formed on the control gate layer 216. In subsequent stages of fabrication, as explained below, periphery devices will be defined in gate stack 215. It will be appreciated by those skilled in the art that various integrated circuit devices include passive elements, such as capacitors, and active elements, such as transistors, and that for some embodiments such active and passive elements are formed in the periphery.

For one embodiment, the substrate 202 is a monocrystalline silicon substrate. For a further embodiment, substrate 202 is a P-type monocrystalline silicon substrate. The tunnel dielectric layer 204 and the gate dielectric layer 214, for one embodiment, are each an oxide layer that can be blanket deposited or thermally grown on substrate 202. For another embodiment, floating gate layer 206 is a silicon-containing layer, preferably a polysilicon (polycrystalline silicon) layer, but could also include other forms of doped or undoped silicon materials, such as monocrystalline silicon, nanocrystalline silicon, and amorphous silicon.

Intergate dielectric layer 208 may be one or more layers of dielectric material. For example, intergate dielectric layer 208 could be of a multi-layer dielectric material commonly referred to as ONO (oxide-nitride-oxide). Other dielectric materials may be substituted for the ONO, such as tantalum oxide, barium strontium titanate, silicon nitride, and other materials providing dielectric properties.

The word line 210 and control gate layer 216 are each generally one or more layers of conductive material. For one embodiment, word line 210 and control gate layer 216 each contain a conductively-doped polysilicon. For a further embodiment, word line 210 and control gate layer 216 each include a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, word line 210 and control gate layer 216 each contain multiple metal-containing layers, e.g., a titanium nitride (TiN) barrier layer overlying the intergate dielectric layer 208 or the gate dielectric layer 214, a titanium (Ti) adhesion layer overlying the barrier layer, and a tungsten (W) layer overlying the adhesion layer. For one embodiment, protective cap layers 212 and 218 each may be a nitride layer, e.g., a silicon nitride ($Si_3N_4$) layer.

Figure 2B:
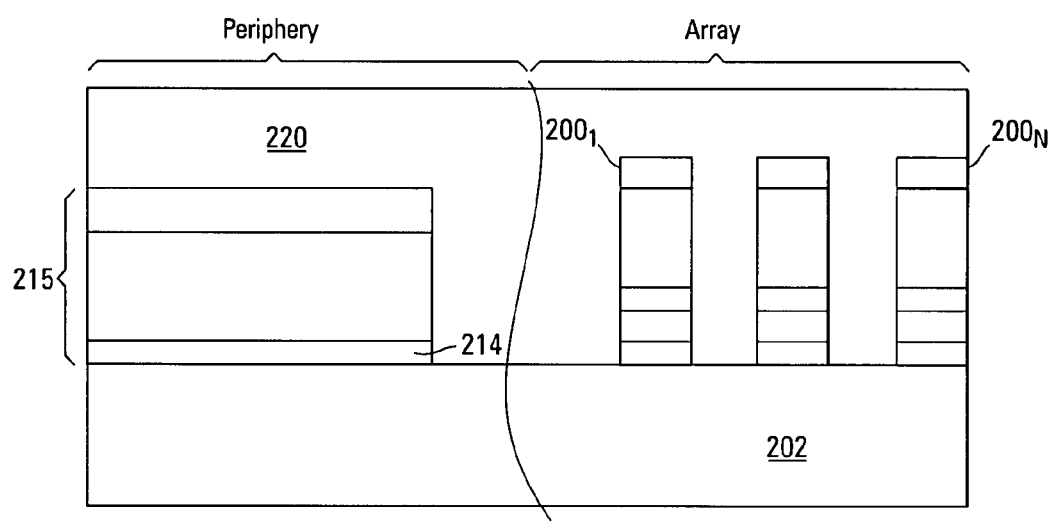
Figure 2C:
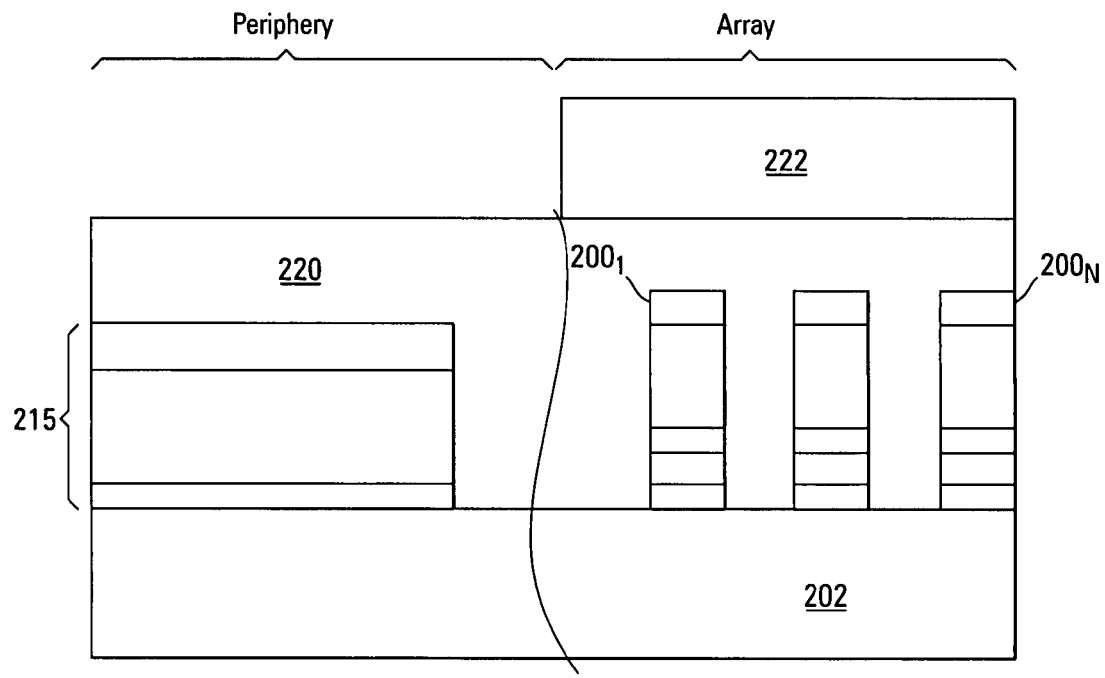

A non-imaging mask (or resist) layer 220, e.g., of a material does not react to photo processing is formed overlying gate stack 215, memory cells 200, and substrate 202 in FIG. 2B. For one embodiment, the material of non-imaging resist layer 220 is in the form of a viscous liquid, such as a phenolic resin solution, before it is applied and is spun onto the array and the periphery. In FIG. 2C, an imaging resist layer 222, such as a layer of photo resist, is formed overlying the non-imaging resist layer 220 and is patterned to expose at least a portion of non-imaging resist layer 220.

Figure 2D:
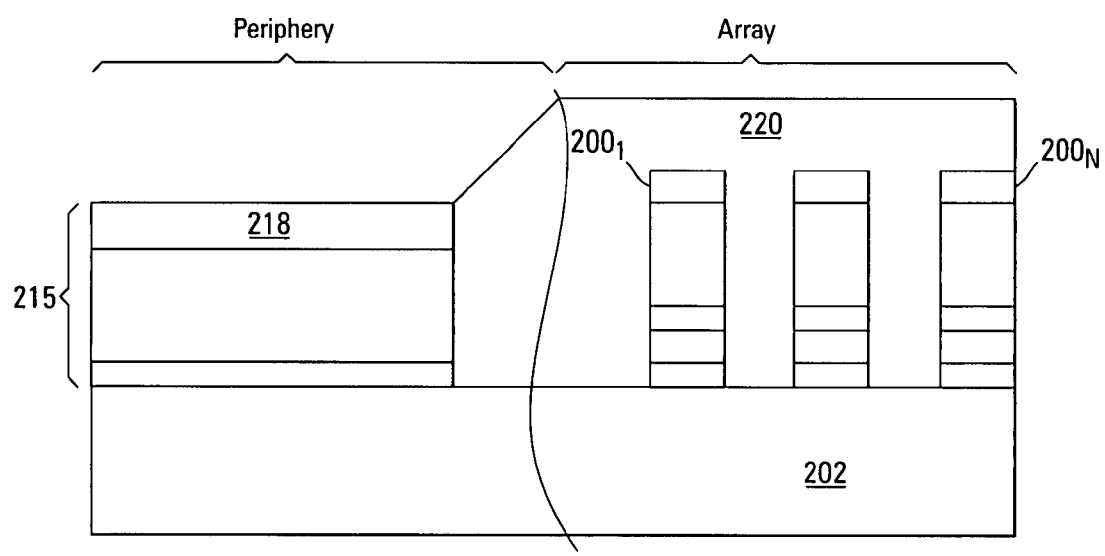

The exposed non-imaging resist layer 220 and the imaging resist layer 222 are respectively removed substantially concurrently from the periphery and the array, e.g., using a dry-develop etch, in FIG. 2D. This exposes the gate stack 215 of the periphery and the non-imaging resist layer 220 overlying the array. For one embodiment, the imaging resist layer 222 is not entirely removed from the array and a portion of the imaging resist layer 222 remains overlying the non-imaging resist layer 220 in the array. Note that the imaging resist layer 222 acts as a sacrificial layer that protects the non-imaging resist layer 220 from being removed from the array as the non-imaging resist layer 220 is removed from the periphery. Leaving the non-imaging resist layer 220 on the array protects the array while the logic devices are formed in the periphery.

Figure 2E:
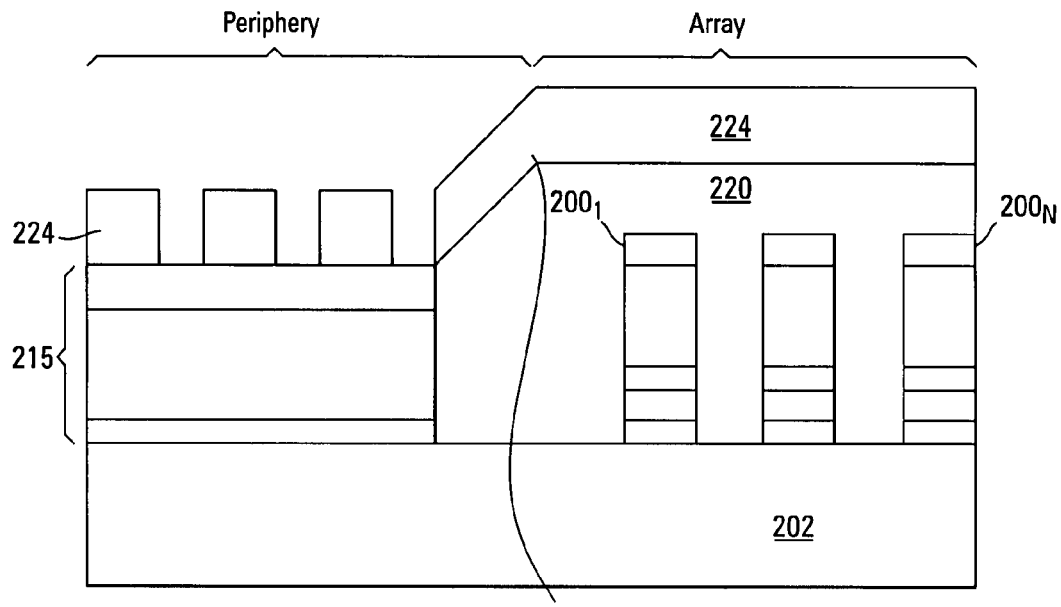
Figure 2F:
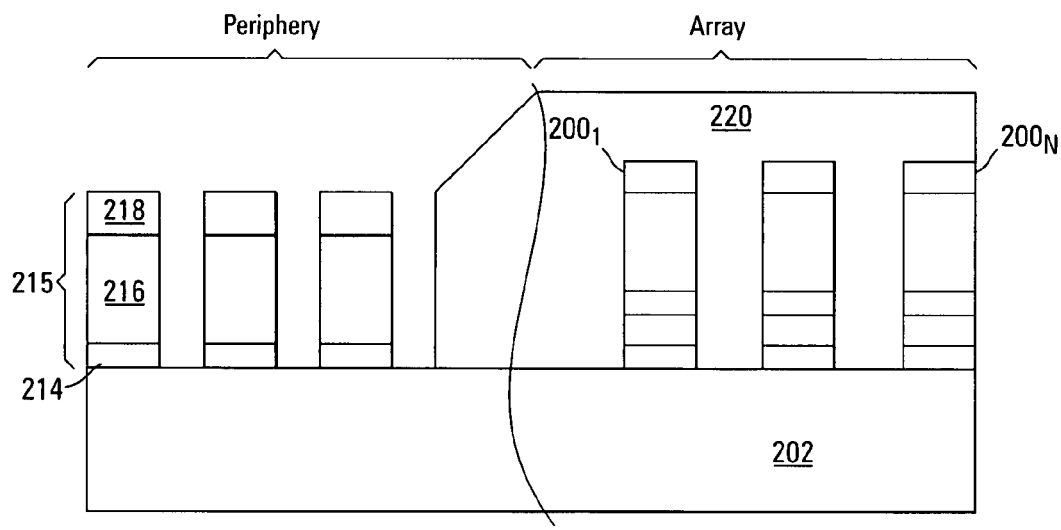

A thin mask (or imaging resist) layer 224, such as a layer of photo resist, e.g., having a thickness in a range from about 2000 angstroms to about 4000 angstroms, is formed overlying gate stack 215 in the periphery and the non-imaging resist layer 220 in the array in FIG. 2E. The imaging resist layer 224 is then patterned overlying the periphery for exposing portions of gate stack 215 for defining the logic devices in the periphery. Portions of the protective cap layer 218, the control gate layer 216, and the gate dielectric layer 214 are removed, e.g., by etching, in FIG. 2F. For some embodiments, the thickness of the imaging resist layer 224 is such that all of the imaging resist layer 224 is removed from the periphery and the array during definition of the periphery devices, as shown in FIG. 2F. For other embodiments, the thickness of the imaging resist layer 224 is such that some of the imaging resist layer 224 remains overlying the periphery and the array after such definition.

Note that for one embodiment the thickness of the imaging resist layer 224 is just enough to start defining the logic devices, and the protective cap layer 218 acts as a mask for finishing the etch. Moreover, the non-imaging resist layer 220 acts to protect the array during etching. This enables the thickness of the imaging resist layer 224 to be thin enough to overcome the problems associated with using an imaging resist layer that is thick enough to protect the array without the non-imaging resist layer 220, such as toppling of the thicker imaging resist layer and/or being unable to maintain critical dimensions when using the thicker imaging resist layer.

Figure 2G:
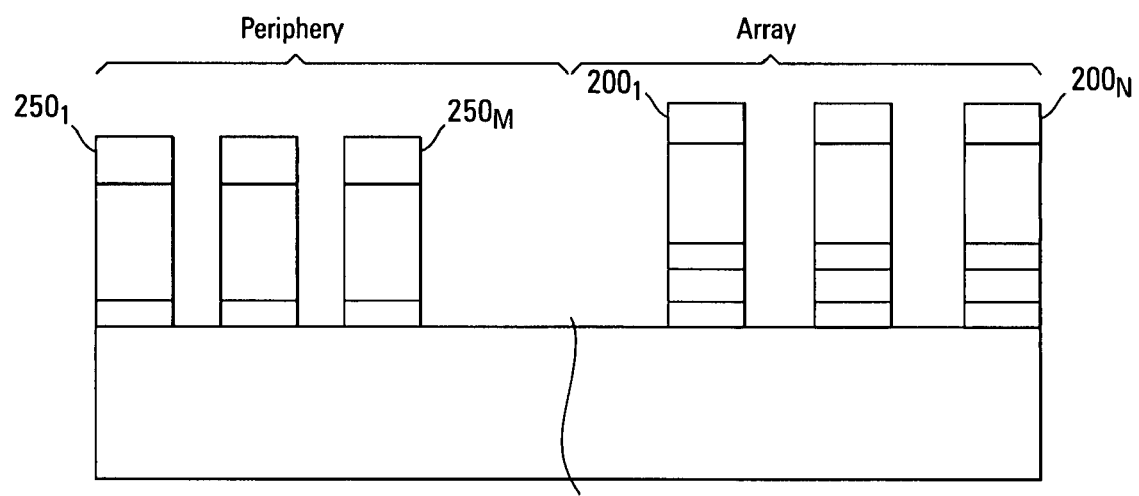

The non-imaging resist layer 220 and any remaining portions of the imaging resist layer 224 are removed in FIG. 2G. For one embodiment a standard photo-processing strip, e.g., that includes a plasma strip followed by an application of sulfuric acid mixed with hydrogen peroxide for removing any residual material, accomplishes this.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming an integrated circuit device, comprising:
   forming a first mask layer overlying a first portion of a semiconductor substrate, wherein the first mask layer further overlies a second mask layer overlying a second portion of the semiconductor substrate and overlying a memory cell formed overlying the second portion of the semiconductor substrate;
   patterning the first mask layer overlying the first portion of the semiconductor substrate to define areas for removal of one or more layers of material interposed between the semiconductor substrate and the first mask layer; and
   removing portions of the one or more layers of material exposed by the patterned first mask layer to define elements of the integrated circuit device overlying the first portion of the semiconductor substrate;
   wherein a portion of the second mask layer is removed from the first portion of the semiconductor substrate before forming the first mask layer.

2. The method of claim 1, wherein removing portions of the one or more layers of material exposed by the patterned first mask layer further comprises removing a portion of the first mask layer or the entire first mask layer overlying the first portion of the substrate and the second mask layer.

3. The method of claim 2 further comprises removing the second mask layer and any remaining portions of the first mask layer.

4. The method of claim 1, wherein a thickness of the first mask layer is in a range from about 2000 angstroms to about 4000 angstroms.

5. The method of claim 1, wherein the second mask layer is of a material that does not react to photo processing.

6. The method of claim 1, wherein the first mask layer is a layer of photo resist.

7. The method of claim 1, wherein removing portions of the one or more layers of material exposed by the patterned first mask layer comprises etching.

8. A method of forming an integrated circuit device, comprising:
   forming a first mask layer, the first mask layer having a first portion overlying a first portion of a semiconductor substrate and a second portion overlying a second portion of the semiconductor substrate;
   forming a second mask layer overlying the second portion of the first mask layer, leaving uncovered at least the first portion of the first mask layer;
   removing the first portion of the first mask layer and removing the second mask layer substantially concurrently;
   forming a third mask layer, the third mask layer having a first portion overlying the first portion of a semiconductor substrate and a second portion overlying the second portion of the first mask layer;
   patterning the first portion of the third mask layer to define areas for removal of one or more layers of material interposed between the first portion of the semiconductor substrate and the first portion of third mask layer; and
   removing portions of the one or more layers of material exposed by the patterned first portion of the third mask layer to define elements of the integrated circuit device overlying the first portion of the semiconductor substrate.

9. The method of claim 8, wherein removing portions of the one or more layers of material exposed by the patterned first portion of the third mask layer further comprises removing a portion of the first and second portions of the third mask layer or the entire first and second portions of the third mask layer.

10. The method of claim 9 further comprises removing the first mask layer and any remaining portions of the third mask layer.

11. The method of claim 8, wherein a thickness of the third mask layer is in a range from about 2000 angstroms to about 4000 angstroms.

12. The method of claim 8, wherein the first mask layer is of a material that does not react to photo processing.

13. The method of claim 8, wherein removing the first portion of the first mask layer and removing the second mask layer substantially concurrently further comprises leaving a portion of the second mask layer on the second portion of the first mask layer.

14. The method of claim 8, wherein the second mask layer is a layer of photo resist.

15. The method of claim 8, wherein the third mask layer is a layer of photo resist.

16. The method of claim 8, wherein removing portions of the one or more layers of material exposed by the patterned first portion of the third mask layer comprises etching.

17. The method of claim 8, wherein removing the first portion of the first mask layer and removing the second mask layer substantially concurrently comprises a dry-develop etch.

18. The method of claim 8, wherein forming a first mask layer comprises spinning a material of the first mask layer overlying the first and second portions of the semiconductor substrate.

19. The method of claim 18, wherein spinning the material of the first mask layer overlying the first and second portions of the semiconductor substrate comprises spinning a phenolic resin solution overlying the first and second portions of the semiconductor substrate.

20. A method of forming a memory device, comprising:
forming a first mask layer, the first mask layer having a first portion overlying a gate stack that overlies a first portion of a semiconductor substrate and a second portion overlying a second mask layer that overlies a memory array that overlies a second portion of the semiconductor substrate;
patterning the first portion of the first mask layer to define areas of the gate stack for removal; and
removing the areas of the gate stack defined for removal to define elements of the memory device in the gate stack;
wherein a portion of the second mask layer is removed from the gate stack before forming the first layer.

21. The method of claim 20, wherein removing the areas of the gate stack further comprises removing a portion of the first and second portions of the first mask layer or the entire first and second portions of the first mask layer from the gate stack and the memory array.

22. The method of claim 21 further comprises removing the second mask layer and any remaining portions of the first mask layer.

23. The method of claim 20, wherein a thickness of the first mask layer is in a range from about 2000 angstroms to about 4000 angstroms.

24. The method of claim 20, wherein the second mask layer is of a material that does not react to photo processing.

25. The method of claim 20, wherein the first mask layer is a layer of photo resist.

26. The method of claim 20, wherein the memory array is a NAND or a NOR memory array.

27. The method of claim 20, wherein the memory array comprises floating-gate memory cells.

28. The method of claim 27, wherein the floating-gate memory cells are floating-gate transistors.

29. The method of claim 20, wherein the elements comprise field-effect transistors.

* * * * *